US009510106B2

(12) United States Patent
Khenkin et al.

(10) Patent No.: US 9,510,106 B2
(45) Date of Patent: Nov. 29, 2016

(54) MICROELECTROMECHANICAL SYSTEMS (MEMS) MICROPHONE HAVING TWO BACK CAVITIES SEPARATED BY A TUNING PORT

(71) Applicant: INVENSENSE, INC., San Jose, CA (US)

(72) Inventors: Aleksey S. Khenkin, Nashua, NH (US); Anthony D. Minervini, Palo Hills, IL (US)

(73) Assignee: INVENSENSE, INC., San Jose, CA (US)

(*) Notice: Subject to any disclaimer, the term of this patent is extended or adjusted under 35 U.S.C. 154(b) by 0 days.

(21) Appl. No.: 14/244,149

(22) Filed: Apr. 3, 2014

(65) Prior Publication Data

US 2015/0289045 A1 Oct. 8, 2015

(51) Int. Cl.
*H04R 19/00* (2006.01)

(52) U.S. Cl.
CPC ....... *H04R 19/005* (2013.01); *H04R 2201/003* (2013.01)

(58) Field of Classification Search
CPC ................................ H04R 1/08; H04R 1/083
See application file for complete search history.

(56) References Cited

U.S. PATENT DOCUMENTS 8,428,284 B2 * 4/2013 Meyer .................. H04R 1/323 181/155
8,447,057 B2 * 5/2013 Goida ..................... H04R 1/02 381/175
9,236,275 B2 * 1/2016 Yeh ........................ H01L 21/56
2010/0284553 A1 * 11/2010 Conti ................... B81B 7/0061 381/174
2012/0093346 A1 * 4/2012 Feiertag et al. .............. 381/174
2012/0161259 A1 * 6/2012 Loeppert et al. ............. 257/416
2013/0070940 A1 * 3/2013 Khenkin et al. .............. 381/111
2013/0322656 A1 * 12/2013 Adams ..................... H04R 1/26 381/120
2014/0307909 A1 * 10/2014 Yang .................... H04R 19/005 381/369
2015/0003638 A1 * 1/2015 Kasai ........................... 381/122

FOREIGN PATENT DOCUMENTS

WO WO 2013129389 A1 * 9/2013 .............. H04R 1/08

OTHER PUBLICATIONS

ST, Tutorial for Mems microphones AN4426 Apllication note, Rev1 , Jan. 2014, pp. 1-18.*

* cited by examiner

*Primary Examiner* — Fan Tsang
*Assistant Examiner* — Angelica M McKinney
(74) *Attorney, Agent, or Firm* — Amin, Turocy & Watson, LLP

(57) ABSTRACT

Microelectromechanical systems (MEMS) microphones associated with a tunable back cavity are described. Provided implementations can comprise a MEMS acoustic sensor element associated with a first back cavity, which first back cavity can be separated and/or acoustically coupled by a tuning port to a second back cavity. In addition, various physical and acoustic filtering configurations of MEMS microphones and tunable back cavities are described.

23 Claims, 7 Drawing Sheets

200
114
112
110
108
106
102
104
116
118

MICROELECTROMECHANICAL SYSTEMS (MEMS) MICROPHONE HAVING TWO BACK CAVITIES SEPARATED BY A TUNING PORT

TECHNICAL FIELD

The subject disclosure relates to microelectromechanical systems (MEMS) microphones.

BACKGROUND

Conventionally, microelectromechanical systems (MEMS) microphones can comprise a MEMS chip attached to a substrate. These MEMS chips are generally enclosed by a cover or lid forming a single acoustic back cavity. An acoustic input can be provided from an opening on a top surface of the microphone such as on the cover or lid or from an opening on the substrate. Typically, in conventional applications where the acoustic input is from the top, an acoustic back cavity is formed mainly by a volume under the MEMS chip and the substrate. By contrast, in conventional applications where the acoustic input is from the bottom, an acoustic back cavity is typically formed by the volume enclosed by the substrate and the cover or lid.

However, acoustic characteristics such as sensitivity, frequency response, etc. of such conventional MEMS microphones are limited by the MEMS microphones' device characteristics and the physical constraints imposed on the geometry of the package by the end user application, and as such, conventional MEMS microphones are typically limited in their capability for tuning the acoustic characteristics. In addition, such configurations of conventional MEMS microphones typically lack robustness in terms of absorbing acoustic shock. For example, conventional MEMS microphones can have difficulty withstanding an extreme acoustic shock that they can be subjected to in a guided drop test that is proposed to become an industry standard.

It is thus desired to provide MEMS microphones that improve upon these and other deficiencies. The above-described deficiencies of MEMS microphones are merely intended to provide an overview of some of the problems of conventional implementations, and are not intended to be exhaustive. Other problems with conventional implementations and techniques and corresponding benefits of the various aspects described herein may become further apparent upon review of the following description.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

In a non-limiting example, a MEMS microphone device associated with a tunable back cavity is provided that can withstand acoustic impacts, according to aspects of the subject disclosure. Thus, a device comprising a first package comprising a MEMS acoustic sensor element (e.g., a MEMS acoustic sensor element configured to operate at a predetermined resonance frequency) is described. The MEMS acoustic sensor element can be associated with a first back cavity. In addition, the device can comprise a second package comprising a lid and a package substrate. According to an aspect, the package substrate can be provided with a port adapted to receive acoustic waves, and the second package can comprise a second back cavity associated with the MEMS acoustic sensor element.

In a further aspect, the second package can house the MEMS acoustic sensor element, and can have a tuning port that can separate and/or acoustically couple the first and second back cavities. Additionally, the tuning port can be configured as a baffle assembly that can restrict airflow between the first back cavity and the second back cavity in response to an acoustic impulse that facilitates the MEMS acoustic sensor element withstanding acoustic impacts.

Moreover, an exemplary microphone associated with a tunable back cavity is described. For instance, an exemplary microphone can comprise a MEMS microphone element (e.g., a MEMS microphone element configured to operate at a predetermined resonance frequency). An ASIC substrate can be communicatively coupled to the MEMS microphone element. In an aspect, MEMS microphone element can be associated with a first back cavity. In addition, an exemplary microphone can comprise a microphone package enclosure including a microphone package substrate and a lid that can house the MEMS microphone element and can form a second back cavity.

In a further aspect, the microphone package enclosure can promote the direction of an acoustic pressure to a port in the microphone package substrate, which can direct the acoustic pressure to the MEMS microphone element. Additionally, a tuning port can be provided between the first back cavity and the second back cavity. In another aspect, the tuning port can be configured as a baffle assembly that can restrict airflow between the first back cavity and the second back cavity in response to an acoustic impulse that facilitates the MEMS microphone element withstanding acoustic impacts.

In a further non-limiting aspect, exemplary methods associated with MEMS microphones associated with tunable back cavities are provided.

These and other embodiments are described in more detail below.

BRIEF DESCRIPTION OF THE DRAWINGS

Various non-limiting embodiments are further described with reference to the accompanying drawings in which.

DETAILED DESCRIPTION

Overview

Figure 1:
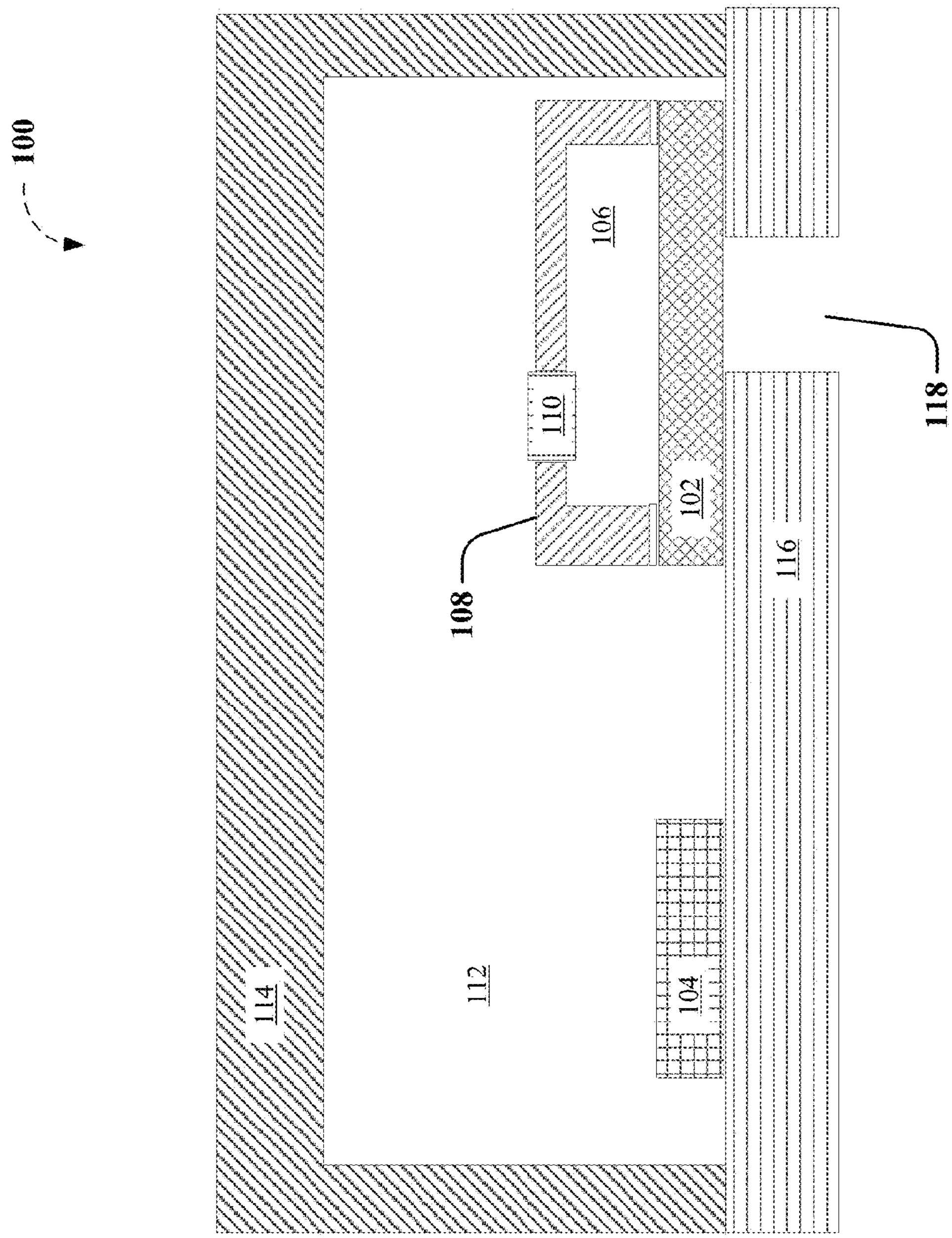
FIG. 1 depicts a non-limiting schematic diagram of a microelectromechanical systems (MEMS) microphone associated with a tunable back cavity, in which an application specific integrated circuit (ASIC) chip associated with the MEMS microphone is located in a second back cavity, according to various non-limiting aspects of the subject disclosure.

While a brief overview is provided, certain aspects of the subject disclosure are described or depicted herein for the purposes of illustration and not limitation. Thus, variations of the disclosed embodiments as suggested by the disclosed apparatuses, systems and methodologies are intended to be encompassed within the scope of the subject matter disclosed herein. For example, the various embodiments of the apparatuses, techniques and methods of the subject disclosure are described in the context of MEMS microphones. However, as further detailed below, various exemplary implementations can be applied to other areas of MEMS acoustic sensor design and packaging, without departing from the subject matter described herein.

Acoustic characteristics such as sensitivity, frequency response, etc. of conventional MEMS microphones are limited by the MEMS microphones' device characteristics and the physical constraints imposed on the geometry of the package by the end user application. In addition, such configurations of conventional MEMS microphones typically lack robustness in terms of absorbing acoustic shock. For example, conventional MEMS microphones can have difficulty withstanding an extreme acoustic shock that they can be subjected to in a guided drop test that is proposed to become an industry standard.

To these and/or related ends, various aspects of MEMS microphones associated with tunable back cavities are described. For instance, exemplary implementations can provide a MEMS microphone associated with a tunable back cavity, which can comprise a MEMS acoustic sensor element associated with a first back cavity. In an aspect, a first back cavity can be separated by and/or acoustically coupled with a tuning port to a second back cavity. In non-limiting implementations, a MEMS microphone associated with a tunable back cavity can comprise a smaller back cavity connected by a specially-tuned port to a larger, package-defined back cavity, such as can be defined by a package lid or cover.

As a non-limiting example, exemplary embodiments of the tuning port or specially-tuned port can comprise a baffle or baffle assembly separating a smaller back cavity and the larger back cavity of a MEMS package, which baffle or baffle assembly can facilitate balancing an initial pressure differential across a backplate/diaphragm of a MEMS acoustic sensor element when it is subjected to an impulsive force from a moving air mass associated with acoustic waves or acoustic pressure applied to the MEMS acoustic sensor element.

A configuration comprising two or more separated and/or acoustically coupled back cavities can enable shaping of a MEMS microphone's high-frequency response independently of its sensitivity. As a non-limiting example, for acoustic waves or acoustic pressure at low frequencies, both back cavities of a two-cavity system (e.g., first and second back cavities) can act together as a single "large" cavity, taking advantage of the maximum volume available for sensitivity and low noise. For acoustic waves or acoustic pressure at high frequencies, only the smaller of the two cavities of a two-cavity system (e.g., first and second back cavities), such as a first back cavity associated with a MEMS acoustic sensor element, terminated by the impedance of a tuning port that can separate and/or acoustically couple the first and second back cavities, is active, allowing for reduced high-frequency peaking.

Furthermore, a transition between the two operational modes can be controlled by the design of the tuning port that separates and/or acoustically couples the first and second back cavities, for example, as further described herein. In exemplary embodiments, the tuning port can be implemented as a single hole, which provides a minimum resistance, mass-dominated tuning port), as a set of multiple smaller holes or orifices to increase resistance, as a baffle assembly, and so on, as further described herein. In addition, according to aspects of the subject disclosure, the tuning port that separates and/or acoustically couples the back cavities can be specifically configured according to further design requirements, industry standard, or otherwise, for example, such as withstanding a guided drop test that provides an extreme acoustic shock, to facilitate providing MEMS microphones with superior robustness to acoustical shock events.

Exemplary Embodiments

Various aspects or features of the subject disclosure are described with reference to the drawings, wherein like reference numerals are used to refer to like elements throughout. In this specification, numerous specific details are set forth in order to provide a thorough understanding of the subject disclosure. It should be understood, however, that the certain aspects of disclosure may be practiced without these specific details, or with other methods, components, parameters, etc. In other instances, well-known structures and devices are shown in block diagram form to facilitate description and illustration of the various embodiments.

Figure 2:
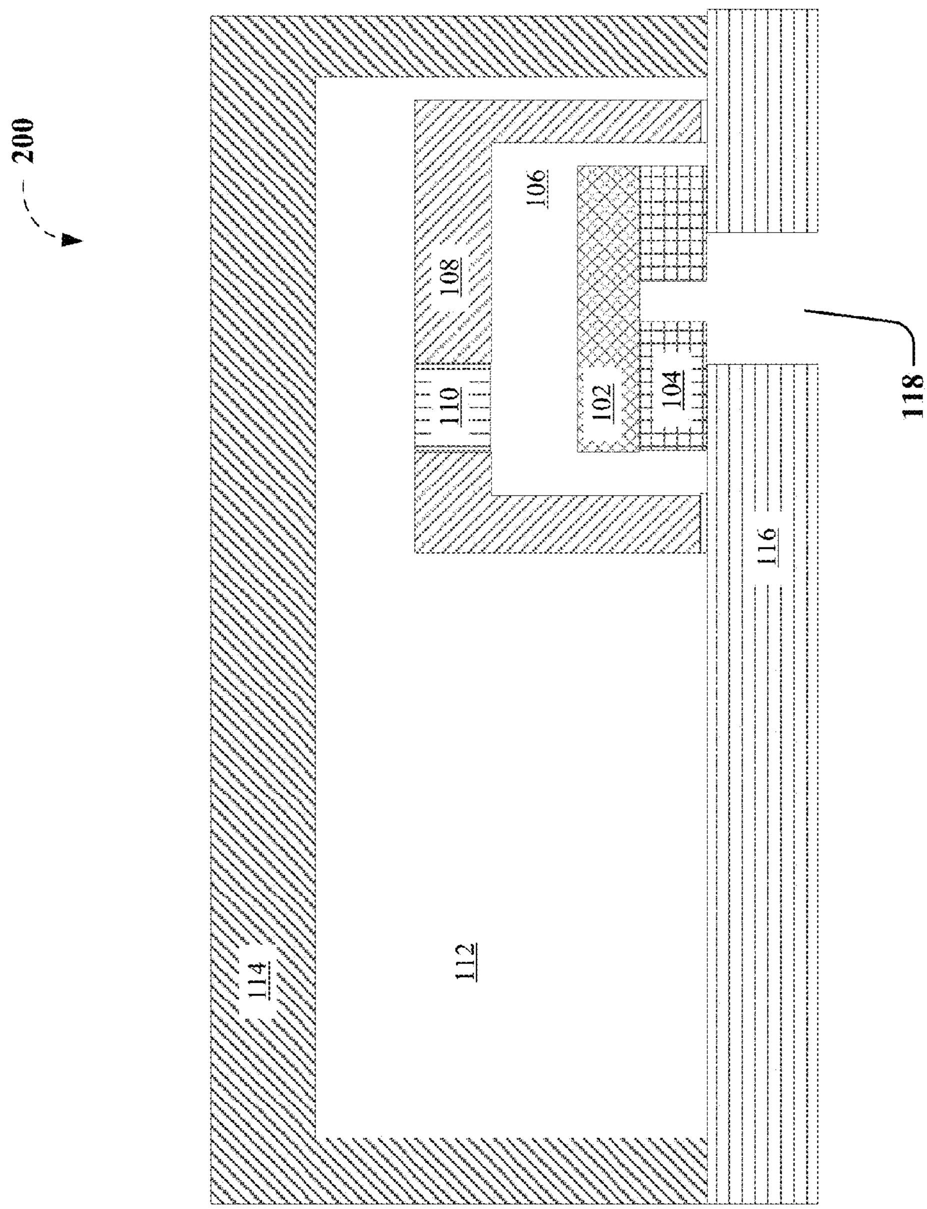
FIG. 2 depicts a further non-limiting schematic diagram of a MEMS microphone associated with a tunable back cavity, in which the ASIC chip associated with the MEMS microphone is located in a first back cavity, according to further non-limiting aspects.

Accordingly, FIGS. 1-2 depict non-limiting schematic diagrams of a device 100/200 (e.g., a MEMS microphone) associated with a tunable back cavity, according to various non-limiting aspects of the subject disclosure. Accordingly, device 100/200 can comprise a MEMS acoustic sensor element 102, such as a MEMS microphone element, wherein the MEMS acoustic sensor element 102 can be configured to operate at a predetermined resonance frequency. In various non-limiting implementations, device 100/200 can also comprise an ASIC complementary metal oxide semiconductor (CMOS) chip 104 associated with the MEMS acoustic sensor element 102. In a non-limiting aspect, MEMS acoustic sensor element 102 can be associated with a first back cavity 106. In exemplary implementations, first back cavity 106 can be defined by an enclosure 108 associated with MEMS acoustic sensor element 102 and having tuning port 110.

In a non-limiting aspect, enclosure 108 can be formed integral to MEMS acoustic sensor element 102 or can be formed separately and bonded to MEMS acoustic sensor element 102. For instance, FIG. 1 depicts enclosure 108 bonded to MEMS acoustic sensor element 102, whereas FIG. 2 depicts enclosure 108 formed separately from MEMS acoustic sensor element 102 and mechanically affixed to package substrate 116 and surrounding MEMS acoustic sensor element 102 and ASIC CMOS 104. Thus, as depicted in FIG. 1, the MEMS acoustic sensor element 102 can comprise the first back cavity 106, whereas as depicted in FIG. 2, the first back cavity 106 houses the MEMS acoustic sensor element 102.

In further non-limiting implementations, device 100/200 can comprise a second back cavity 112, which can be defined by a lid or cover 114 attached to package substrate 116, according to a non-limiting aspect. In various non-limiting aspects, one or more of MEMS acoustic sensor element 102, ASIC CMOS chip 104, enclosure 108 and/or lid or cover 114 can be one or more of electrically coupled or mechanically affixed to package substrate 116, via methods available to those skilled in the art. In addition, MEMS acoustic sensor element 102 can be mechanically, electrically, and/or communicatively coupled to the ASIC CMOS chip 104 and/or package substrate 116.

As further described herein, tuning port 110 can comprise a port, a set of holes or orifices, a baffle, and/or other configurations selected to provide a desired impedance of tuning port 110, according to various design considerations. In various non-limiting implementations, tuning port 110 can separate and/or acoustically couple the first back cavity 106 to the second back cavity 112 to facilitate providing or associating a tunable back cavity with MEMS acoustic sensor element 102. As further described herein, in various non-limiting implementations, tuning port 110 can be configured to provide a second-order acoustic low-pass filter having a cut-off frequency below the predetermined resonance frequency of the MEMS acoustic sensor element 102. In further non-limiting embodiments, tuning port 110 can be configured with a set of holes or orifices configured to provide a first-order acoustic low-pass filter having a cut-off frequency below the predetermined resonance frequency of the MEMS acoustic sensor element 102. Moreover, tuning port 110 can comprise a baffle assembly, which can be configured to restrict an airflow between the first back cavity and the second back cavity in response to an acoustic impulse, according to further non-limiting aspects, as further described herein.

Furthermore, lid or cover 114 and package substrate 116 together can comprise microphone device or package 100/200, to which a customer printed circuit board (PCB) (not shown) having an orifice or other means of passing acoustic waves to MEMS acoustic sensor element 102 can be mechanically, electrically, and/or communicatively coupled. For example, acoustic waves can be received at MEMS acoustic sensor element 102 via package substrate 116 having port 118 adapted to receive acoustic waves. An attached or coupled customer PCB (not shown) providing an orifice or other means of passing the acoustic waves facilitates receiving acoustic waves at MEMS acoustic sensor element 102.

Accordingly, various exemplary implementations the subject disclosure provides a device 100/200 comprising a first package comprising a MEMS acoustic sensor element 102 associated with a first back cavity 106, wherein the MEMS acoustic sensor element 102 can be configured to operate at a predetermined resonance frequency. Device 100/200 can further comprise a second package comprising a lid 114 and a package substrate 116, wherein the package substrate 116 has a port 118 adapted to receive acoustic waves. In a further non-limiting aspect, the second package can comprise a second back cavity 112 associated with the MEMS acoustic sensor element 102, wherein the second package houses the MEMS acoustic sensor element 102. In further non-limiting implementations, device 100/200 can comprise a tuning port 110 that can separate and/or acoustically couple the first back cavity 106 and the second back cavity 112.

Note that, except for port 118 in package substrate 116, the combination of package substrate 116 and cover or lid 114 forms an acoustically and/or hermetically sealed enclosure for the MEMS acoustic sensor element 102. This enclosure for the MEMS acoustic sensor element 102 promotes directing acoustic waves and/or an acoustic pressure through port 118 in the package substrate 116 and facilitates directing acoustic waves and/or an acoustic pressure to the MEMS acoustic sensor element 102. Similar function is apparent with respect to the embodiments described below regarding FIGS. 3-7.

Figure 3:
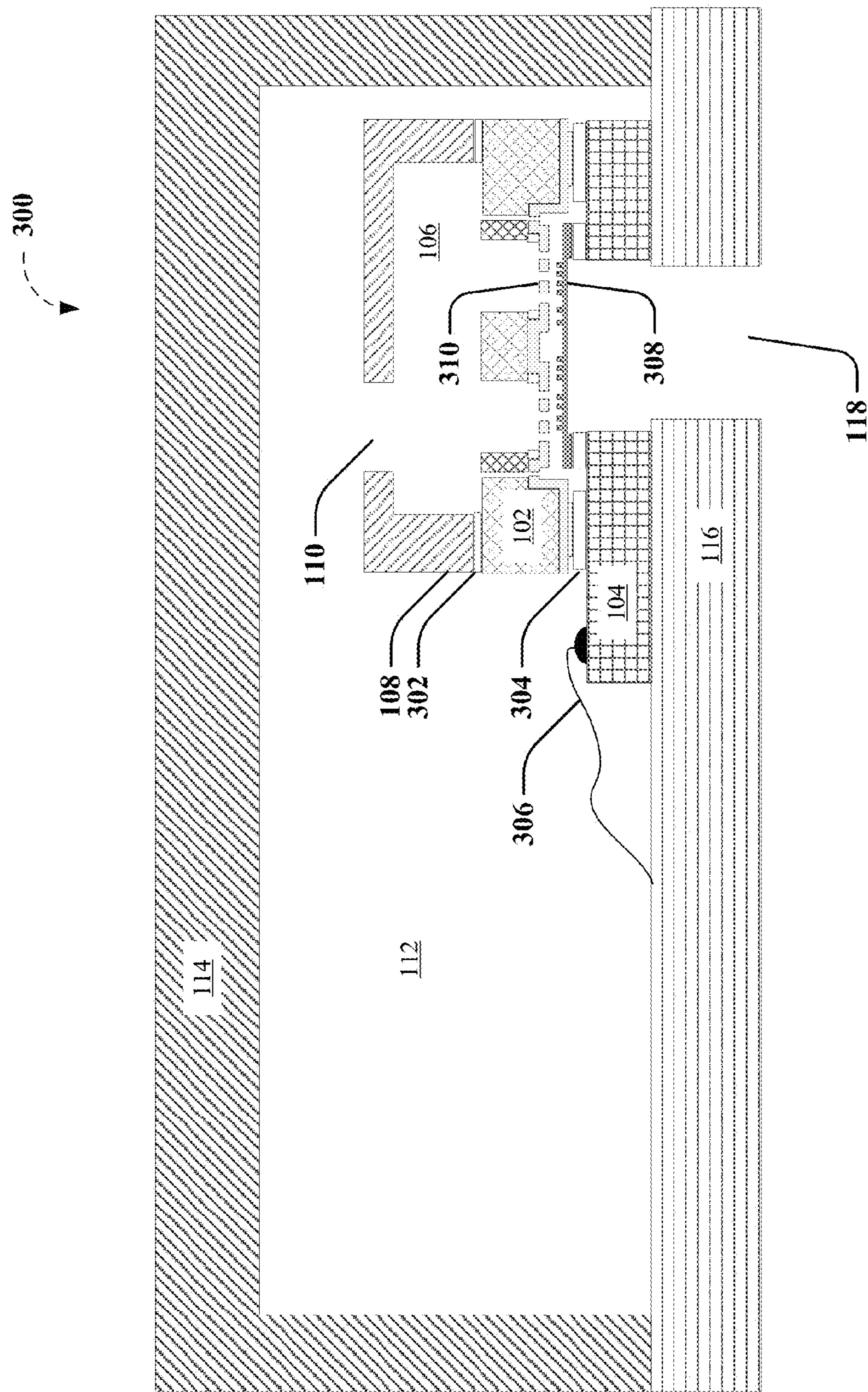
FIG. 3 depicts a further non-limiting schematic cross section of a MEMS microphone associated with a tunable back cavity comprising a first and second back cavity separated by a tuning port, according to further non-limiting aspects as described herein.

For instance, FIG. 3 depicts a further non-limiting schematic cross section of a device 300 (e.g., a MEMS microphone) associated with a tunable back cavity, according to further non-limiting aspects as described herein. Accordingly, device 300 can comprise a MEMS acoustic sensor element 102, such as a MEMS microphone element, wherein the MEMS acoustic sensor element 102 can be configured to operate at a predetermined resonance frequency. In further exemplary embodiments, device 300 can also comprise an ASIC complementary metal oxide semiconductor (CMOS) chip 104 associated with the MEMS acoustic sensor element 102. In various aspects, MEMS acoustic sensor element 102 can comprise a perforated backplate 308 that can act as a stationary electrode in concert with a diaphragm 310 to facilitate the transduction of acoustic waves or pressure into an electrical signal that can be communicatively coupled to ASIC CMOS 104. In a non-limiting aspect, MEMS acoustic sensor element 102 can be associated with a first back cavity 106. In various non-limiting implementations, first back cavity 106 can be defined by an enclosure 108 associated with MEMS acoustic sensor element 102 and having tuning port 110.

As described above, enclosure 108 can be formed integral to MEMS acoustic sensor element 102 or can be formed separately and bonded to MEMS acoustic sensor element 102. Thus, as depicted in FIG. 1, the MEMS acoustic sensor element 102 can comprise the first back cavity 106, whereas as depicted in FIG. 2, the first back cavity 106 houses the MEMS acoustic sensor element 102. In further non-limiting implementations, device 300 can comprise a second back cavity 112, which can be defined by a lid or cover 114 attached to package substrate 116, according to a non-limiting aspect, as further described above.

In various non-limiting aspects, one or more of MEMS acoustic sensor element 102, ASIC CMOS chip 104, enclosure 108 and/or lid or cover 114 can be one or more of electrically coupled or mechanically affixed to package substrate 116, via methods available to those skilled in the art. As non-limiting examples, enclosure 108 can be bonded 302 to MEMS acoustic sensor element 102, MEMS acoustic sensor element 102 can be bonded 304 and electrically coupled to ASIC CMOS chip 104, and ASIC CMOS chip 104 can be bonded and electrically coupled (e.g., wire bonded 306) to package substrate 116. Thus, MEMS acoustic sensor element 102, in the non-limiting example of device 300, is mechanically, electrically, and/or communicatively coupled to the ASIC CMOS chip 104.

As further described herein, tuning port 110 can comprise a port, a set of holes or orifices, a baffle, and/or other configurations selected to provide a desired impedance of tuning port 110, according to various design considerations. In various non-limiting implementations, tuning port 110 can separate and/or acoustically couple the first back cavity 106 to the second back cavity 112 to facilitate providing or associating a tunable back cavity with MEMS acoustic sensor element 102. In the non-limiting example of device 300, tuning port 110 comprises a port that can be configured to provide a second-order acoustic low-pass filter having a cut-off frequency below the predetermined resonance frequency of the MEMS acoustic sensor element 102. Furthermore, lid or cover 114 and package substrate 116 together can comprise microphone device or package 300, to which a customer printed circuit board (PCB) (not shown) having an orifice or other means of passing acoustic waves to MEMS acoustic sensor element 102 can be mechanically, electrically, and/or communicatively coupled. For example, acoustic waves can be received at MEMS acoustic sensor element 102 via package substrate 116 having port 118 adapted to receive acoustic waves. An attached or coupled customer PCB (not shown) providing an orifice or other means of passing the acoustic waves facilitates receiving acoustic waves at MEMS acoustic sensor element 102.

Accordingly, various exemplary implementations the subject disclosure provides a device 300 comprising a first package comprising a MEMS acoustic sensor element 102 associated with a first back cavity 106, wherein the MEMS acoustic sensor element 102 can be configured to operate at a predetermined resonance frequency. Device 300 can further comprise a second package comprising a lid 114 and a package substrate 116, wherein the package substrate 116 has a port 118 adapted to receive acoustic waves. In a further non-limiting aspect, the second package can comprise a second back cavity 112 associated with the MEMS acoustic sensor element 102, wherein the second package houses the MEMS acoustic sensor element 102. In further non-limiting implementations, device 300 can comprise a tuning port 110 that can separate and/or acoustically couple the first back cavity 106 and the second back cavity 112.

For instance, in the exemplary embodiment of FIG. 3, device 300 comprises MEMS acoustic sensor element 102, ASIC CMOS chip 104, first back cavity 106, and a port or an orifice acting as a mass-dominated tuning port 110, second back cavity 112, lid or cover 114, and package substrate 116 (e.g., such as a laminate package substrate) having a port or an orifice 118. In a non-limiting aspect, lid or cover 114 and package substrate 116 together can be considered a microphone package, whereas MEMS acoustic sensor element 102 and first back cavity 106 (e.g., with or without ASIC CMOS chip 104) can be considered a MEMS package.

Thus, FIG. 3 depicts device 300 comprising a MEMS acoustic sensor element 102, such as a MEMS microphone element, associated with a tunable back cavity or back volume separated into two cavities, first back cavity 106 and second back cavity 112. Therein, first back cavity 106 and second back cavity 112 are separated and/or acoustically coupled with tuning port 110 comprising a port, whose dimensions can be selected to create a second-order acoustic low-pass filter with a desired cut-off frequency $F_{BC1}$ in a range below the MEMS resonance frequency (e.g., a predetermined resonance frequency). Accordingly, for device 300, first back cavity 106 and second back cavity 112 can act, acoustically, as a single large cavity below $F_{BC1}$, whereas above $F_{BC1}$, only the smaller first back cavity 106 is loading MEMS acoustic sensor element 102.

Figure 4:
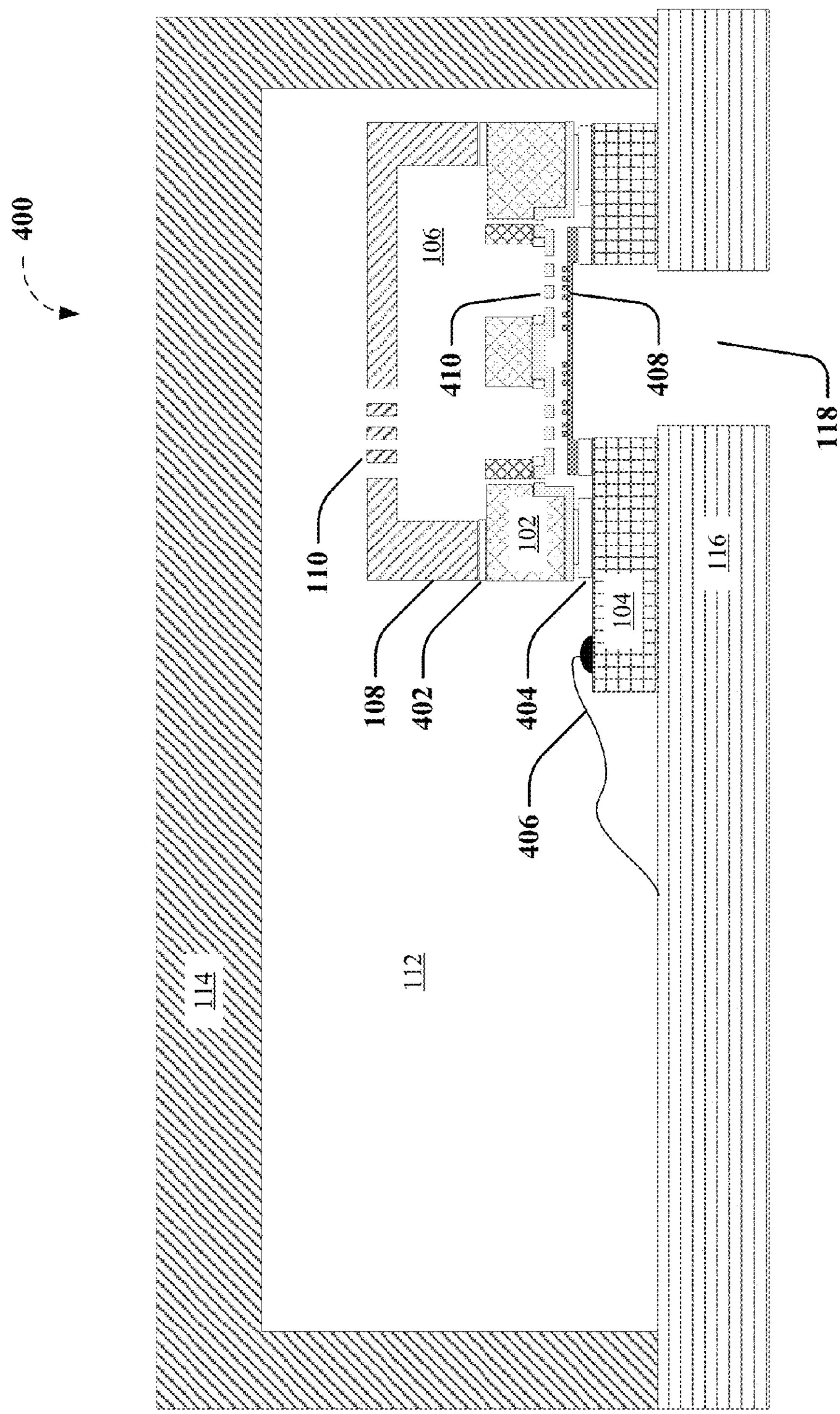
FIG. 4 depicts a schematic cross section of an exemplary MEMS microphone associated with a tunable back cavity comprising a first and second back cavity separated by a tuning port comprised of a set of holes or orifices, according to other non-limiting aspects of the subject disclosure.

FIG. 4 depicts a schematic cross section of an exemplary device 300 (e.g., a MEMS microphone) associated with a tunable back cavity, according to other non-limiting aspects of the subject disclosure. Accordingly, device 400 can comprise a MEMS acoustic sensor element 102, such as a MEMS microphone element, wherein the MEMS acoustic sensor element 102 can be configured to operate at a predetermined resonance frequency. In further exemplary embodiments, device 400 can also comprise an ASIC complementary metal oxide semiconductor (CMOS) chip 104 associated with the MEMS acoustic sensor element 102. In various non-limiting embodiments, MEMS acoustic sensor element 102 can comprise a perforated backplate 408 that can act as a stationary electrode in concert with a diaphragm 410 to facilitate the transduction of acoustic waves or pressure into an electrical signal that can be communicatively coupled to ASIC CMOS 104. In a non-limiting aspect, MEMS acoustic sensor element 102 can be associated with a first back cavity 106. In various non-limiting implementations, first back cavity 106 can be defined by an enclosure 108 associated with MEMS acoustic sensor element 102 and having tuning port 110.

As described above, enclosure 108 can be formed integral to MEMS acoustic sensor element 102 or can be formed separately and bonded to MEMS acoustic sensor element 102. Thus, as depicted in FIG. 1, the MEMS acoustic sensor element 102 can comprise the first back cavity 106, whereas as depicted in FIG. 2, the first back cavity 106 houses the MEMS acoustic sensor element 102. In further non-limiting implementations, device 400 can comprise a second back cavity 112, which can be defined by a lid or cover 114 attached to package substrate 116, according to a non-limiting aspect, as further described above.

In various non-limiting aspects, one or more of MEMS acoustic sensor element 102, ASIC CMOS chip 104, enclosure 108 and/or lid or cover 114 can be one or more of electrically coupled or mechanically affixed to package substrate 116, via methods available to those skilled in the art. As non-limiting examples, enclosure 108 can be bonded 402 to MEMS acoustic sensor element 102, MEMS acoustic sensor element 102 can be bonded 404 and electrically coupled to ASIC CMOS chip 104, and ASIC CMOS chip 104 can be bonded and electrically coupled (e.g., wire bonded 406) to package substrate 116. Thus, MEMS acoustic sensor element 102, in the non-limiting example of device 400, is mechanically, electrically, and/or communicatively coupled to the ASIC CMOS chip 104.

As further described herein, tuning port 110 can comprise a port, a set of holes or orifices, a baffle, and/or other configurations selected to provide a desired impedance of tuning port 110, according to various design considerations. In various non-limiting implementations, tuning port 110 can separate and/or acoustically couple the first back cavity 106 to the second back cavity 112 to facilitate providing or associating a tunable back cavity with MEMS acoustic sensor element 102. In the non-limiting example of device 400, tuning port 110 comprises a set of holes or orifices that can be configured to provide a first-order acoustic low-pass filter having a cut-off frequency below the predetermined resonance frequency of the MEMS acoustic sensor element 102.

Furthermore, lid or cover 114 and package substrate 116 together can comprise microphone device or package 400, to which a customer printed circuit board (PCB) (not shown) having an orifice or other means of passing acoustic waves to MEMS acoustic sensor element 102 can be mechanically, electrically, and/or communicatively coupled. For example, acoustic waves can be received at MEMS acoustic sensor element 102 via package substrate 116 having port 118 adapted to receive acoustic waves. An attached or coupled customer PCB (not shown) providing an orifice or other means of passing the acoustic waves facilitates receiving acoustic waves at MEMS acoustic sensor element 102.

Accordingly, various exemplary implementations the subject disclosure provides a device 400 comprising a first package comprising a MEMS acoustic sensor element 102 associated with a first back cavity 106, wherein the MEMS acoustic sensor element 102 can be configured to operate at a predetermined resonance frequency. Device 400 can further comprise a second package comprising a lid 114 and a package substrate 116, wherein the package substrate 116 has a port 118 adapted to receive acoustic waves. In a further non-limiting aspect, the second package can comprise a second back cavity 112 associated with the MEMS acoustic sensor element 102, wherein the second package houses the MEMS acoustic sensor element 102. In further non-limiting implementations, device 400 can comprise a tuning port 110 that can separate and/or acoustically couple the first back cavity 106 and the second back cavity 112.

For instance, in the exemplary embodiment of FIG. 4, device 400 comprises MEMS acoustic sensor element 102, ASIC CMOS chip 104, first back cavity 106, and a set of holes or orifices acting together as a resistance-dominated tuning port 110, second back cavity 112, lid or cover 114, and package substrate 116 (e.g., such as a laminate package substrate) having a port or an orifice 118. In a non-limiting aspect, lid or cover 114 and package substrate 116 together can be considered a microphone package, whereas MEMS acoustic sensor element 102 and first back cavity 106 (e.g., with or without ASIC CMOS chip 104) can be considered a MEMS package.

Thus, FIG. 4 depicts device 400 comprising a MEMS acoustic sensor element 102, such as a MEMS microphone element, associated with a tunable back cavity or back volume separated into two cavities, first back cavity 106 and second back cavity 112. Therein, first back cavity 106 and second back cavity 112 are separated and/or acoustically coupled with tuning port 110 comprising a set of holes or orifices acting together as a resistance-dominated tuning port 110, whose dimensions can be selected to create a first-order acoustic low-pass filter with a desired cut-off frequency $F_{BC2}$ in a range below the MEMS resonance frequency (e.g., a predetermined resonance frequency). Accordingly, for device 400, first back cavity 106 and second back cavity 112 can act, acoustically, as a single large cavity below $F_{BC2}$, whereas above $F_{BC2}$, only the smaller first back cavity 106 is loading MEMS acoustic sensor element 102. By comparison to the embodiments described in reference to FIG. 3, the transition to loading by the smaller first back cavity 106 can be slower than the embodiments described in reference to FIG. 3. However, for the embodiments described in reference to FIG. 4, an added benefit of improved acoustic shock resistance can be provided by a tuning port 110 comprising a set of holes or orifices acting together as a resistance-dominated tuning port 110. The benefit of improved acoustic shock resistance is explained in more detail regarding the embodiments described with reference to FIG. 5.

Figure 5:
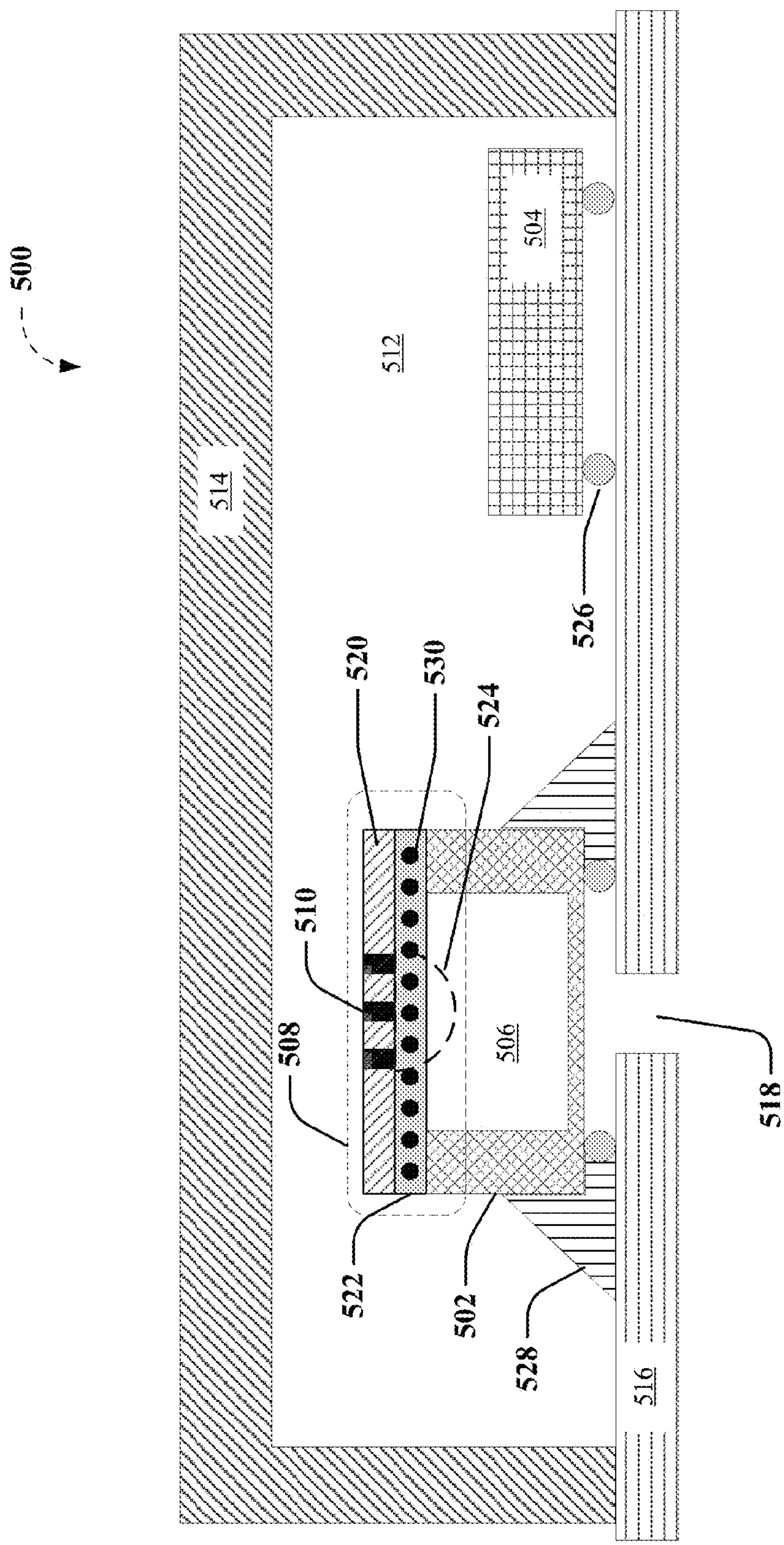
FIG. 5 depicts a non-limiting schematic cross section of an exemplary MEMS microphone associated with a tunable back cavity comprising a first and second back cavity separated by a tuning port comprised of a baffle assembly, according to various non-limiting aspects of the subject disclosure.

FIG. 5 depicts a non-limiting schematic cross section of an exemplary device 500 (e.g., a MEMS microphone) associated with a tunable back cavity, according to various non-limiting aspects of the subject disclosure. Accordingly, device 500 can comprise a MEMS acoustic sensor element 502, such as a MEMS microphone element, wherein the MEMS acoustic sensor element 502 can be configured to operate at a predetermined resonance frequency. In further exemplary embodiments, device 500 can also comprise an ASIC CMOS chip 504 associated with the MEMS acoustic sensor element 502. In various aspects of a flip-chip MEMS device 500 as depicted in FIG. 5, MEMS acoustic sensor element 502 can comprise a perforated backplate (not shown) that can act as a stationary electrode in concert with a diaphragm (not shown) to facilitate the transduction of acoustic waves or pressure into an electrical signal that can be communicatively coupled to ASIC CMOS 504. In a non-limiting aspect, MEMS acoustic sensor element 502 can be associated with a first back cavity 506.

As described above, first back cavity 506 can be formed integral to MEMS acoustic sensor element 502 (e.g., an etched cavity of the MEMS acoustic sensor element 502) or can be formed separately and bonded to MEMS acoustic sensor element 502. Thus, as depicted in FIG. 5, the MEMS acoustic sensor element 502 can comprise the first back cavity 506, whereas as depicted in FIG. 2, the first back cavity 106 houses the MEMS acoustic sensor element 102. In further exemplary embodiments, device 500 can comprise a second back cavity 512, which can be defined by a lid or cover 514 attached to package substrate 516 having port 518 adapted to receive acoustic waves, according to a non-limiting aspect, as further described above. Thus, in exemplary embodiments of device 500, first back cavity 506 can be defined by an etched cavity of the MEMS acoustic sensor element 502 and baffle assembly 508 comprising one or more of baffle plate 520 having tuning port 510, adhesive 522 that seals baffle plate 520 to the etched cavity of the MEMS acoustic sensor element 502, and/or a porous mass 524 suspended from the baffle plate 520 in the etched cavity of the MEMS acoustic sensor element 502.

In various non-limiting aspects, one or more of MEMS acoustic sensor element 502, ASIC CMOS chip 504, and/or lid or cover 514 can be one or more of electrically coupled or mechanically affixed to package substrate 516, via methods available to those skilled in the art. As non-limiting examples, one or more of MEMS acoustic sensor element 502 or ASIC CMOS chip 504 can be electrically coupled to package substrate 516 via one or more solder bump(s) 526 that can facilitate an electrical connection between dies for MEMS acoustic sensor element 502 or ASIC CMOS chip 504 and package substrate 516. Moreover, MEMS acoustic sensor element 502, in the non-limiting example of device 500, can be mechanically affixed and/or acoustically sealed to package substrate 516, via an acoustic sealant 528 (e.g., an acoustic seal ring, etc.), and/or communicatively coupled to the ASIC CMOS chip 504 through package substrate 516.

As further described herein, tuning port 510 can comprise a port, a set of holes or orifices, a baffle assembly 508, and/or other configurations selected to provide a desired impedance of tuning port 510, according to various design considerations. In various non-limiting implementations, tuning port 510 can separate and/or acoustically couple the first back cavity 506 to the second back cavity 512 to facilitate providing or associating a tunable back cavity with MEMS acoustic sensor element 502. In the non-limiting example of device 500, tuning port 510 comprises a baffle assembly 508, which can be configured to restrict an airflow between the first back cavity and the second back cavity in response to an acoustic impulse, according to further non-limiting aspects, as further described herein. For instance, as described above, an exemplary non-limiting baffle assembly 508 can comprise one or more of a baffle plate 520 having tuning port 510, an adhesive 522 that seals baffle plate 520 to the etched cavity of the MEMS acoustic sensor element 502, and/or a porous mass 524 suspended from the baffle plate 520 in the etched cavity of the MEMS acoustic sensor element 502. As can be understood, tuning port 510, in conjunction with baffle plate 520, adhesive 522 having air voids 530 in the adhesive 522 seal, and/or size or porosity of the porous mass 524 can be configured to provide a predetermined acoustic impedance of the baffle assembly 508, as further described herein.

Furthermore, lid or cover 514 and package substrate 516 together can comprise microphone device or package 500, to which a customer printed circuit board (PCB) (not shown) having an orifice or other means of passing acoustic waves to MEMS acoustic sensor element 502 can be mechanically, electrically, and/or communicatively coupled. For example, acoustic waves can be received at MEMS acoustic sensor element 502 via package substrate 516 having port 518 adapted to receive acoustic waves. An attached or coupled customer PCB (not shown) providing an orifice or other means of passing the acoustic waves facilitates receiving acoustic waves at MEMS acoustic sensor element 502.

Accordingly, various exemplary implementations of the subject disclosure provides a device 500 comprising a first package comprising a MEMS acoustic sensor element 502 associated with a first back cavity 506, wherein the MEMS acoustic sensor element 502 can be configured to operate at a predetermined resonance frequency. Device 500 can further comprise a second package comprising a lid 514 and a package substrate 516, wherein the package substrate 516 has a port 518 adapted to receive acoustic waves. In a further non-limiting aspect, the second package can comprise a second back cavity 512 associated with the MEMS acoustic sensor element 502, wherein the second package houses the MEMS acoustic sensor element 502. In further non-limiting implementations, device 500 can comprise a tuning port 510 and/or baffle assembly 508 that can separate and/or acoustically couple the first back cavity 506 and the second back cavity 512.

For instance, in the exemplary embodiment of FIG. 5, device 500 comprises MEMS acoustic sensor element 502, ASIC CMOS chip 504, first back cavity 506, and a set of holes or orifices acting together in the baffle plate 520 as a resistance-dominated tuning port 510, second back cavity 512, lid or cover 514, and package substrate 516 (e.g., such as a laminate package substrate) having a port or an orifice 518. In a non-limiting aspect, lid or cover 514 and package substrate 516 together can be considered a microphone package, whereas MEMS acoustic sensor element 502 and first back cavity 506 (e.g., with or without ASIC CMOS chip 504) can be considered a MEMS package.

Thus, FIG. 5 depicts device 500 comprising a MEMS acoustic sensor element 502, such as a MEMS microphone element, associated with a tunable back cavity or back volume separated into two cavities, first back cavity 506 and second back cavity 512. Therein, first back cavity 506 and second back cavity 512 are separated and/or acoustically coupled with tuning port 510 and/or baffle assembly 508 (e.g., comprising a baffle plate 520, adhesive 522, and porous mass 524 suspended from baffle plate 520 in the etched cavity of the MEMS acoustic sensor element 502), which can add acoustic impedance on the back side of the MEMS acoustic sensor element 502, thereby resulting in a restriction of air flow during an impulsive acoustic event, for which the acoustic impedance can be tuned by adjusting the configurations of holes or orifices in the baffle plate 520, air voids 530 in the adhesive 522 seal, and/or sizes and/or porosity of the porous mass 524.

While, for the purposes of illustration, and not limitation, various non-limiting implementations of the subject disclosure are described herein in reference to placement, location, configuration, and so on, of the MEMS acoustic sensor element 502, the ASIC CMOS chip 504, etc., it can be understood that variations of the subject disclosure are possible within the scope of claims appended to the subject matter disclosed herein. For instance, it can be understood that other chip fabrication methods, methods of mechanical attachment, electrical connection, integration, ordering, placement, and so on can be employed or be desirable in conjunction with the subject disclosure, depending on, for instance, design considerations, etc. For instance, a tunable back volume or cavity can be partitioned into two or more sub-back-cavities or volumes. As a non-limiting illustration, under normal conditions in which a microphone is intended to operate, the two or more sub-back-cavities or volumes can be designed and implemented to acoustically behave as one back volume. Whereas for an acoustic impulse, the back cavity or volume immediately adjacent to the diaphragm or backplate can be bounded by the tuning port 110/510 or baffle assembly 508, which can serve to counter act external forces against the diaphragm or backplate by restricting air flow. As a result the smaller volume of the immediately adjacent back cavity or volume can balance with the volume of air-mass rushing in to the diaphragm or backplate from the outside of the package.

Accordingly, in various non-limiting implementations, the subject disclosure provides a microphone (e.g., device 100/200/300/400/500). In various non-limiting implementations, an exemplary microphone can comprise a MEMS microphone element (e.g., MEMS acoustic sensor element 102/502 configured to operate at a predetermined resonance frequency) associated with a first back cavity 106/506 and a microphone package enclosure comprising a microphone package substrate 116/516 and a lid 114/514 that houses the MEMS microphone element and forms a second back cavity 112/512, wherein the microphone package enclosure promotes the direction of an acoustic pressure through a port 118/518 in the microphone package substrate 116/516 adapted to direct the acoustic pressure to the MEMS microphone element (e.g., MEMS acoustic sensor element 102/502).

In further non-limiting implementations, an exemplary microphone can further comprise a tuning port 110/510 between the first back cavity 106/506 and the second back cavity 112/512. In still other non-limiting implementations, an exemplary microphone as described herein can comprise an ASIC substrate (e.g., ASIC CMOS chip 104/504) communicatively coupled to the MEMS microphone element. As described above regarding FIGS. 1 and 5, for example, the MEMS microphone element can comprise the first back cavity 106/506. For instance, first back cavity 506 can be formed integral to MEMS acoustic sensor element 502 (e.g., an etched cavity of the MEMS acoustic sensor element 502), whereas first back cavity 106 can be bonded to MEMS acoustic sensor element 102, as described above. Alternatively, as described above regarding FIG. 2, for example, the first back cavity 106 can house the MEMS acoustic sensor or microphone element 102. According to various aspects, the tuning port 110/510 can be configured to provide a second-order acoustic low-pass filter having a cut-off frequency below the predetermined resonance frequency MEMS microphone element and/or the tuning port 110/510 can comprise a set of holes or orifices that can be configured to provide a first-order acoustic low-pass filter having a cut-off frequency below the predetermined resonance frequency MEMS microphone element. In other non-limiting aspects, tuning port 110/510 can comprise a baffle assembly 508, as further described above, for example, that can be configured to restrict an airflow between the first back cavity 106/506 and the second back cavity 112/512 in response to an acoustic impulse. For instance, as further described above, an exemplary baffle assembly 508 can comprise one or more of multiple orifices, an adhesive 522 seal, or a porous mass configured 524 to provide a predetermined acoustic impedance of the baffle assembly 508.

Figure 6:
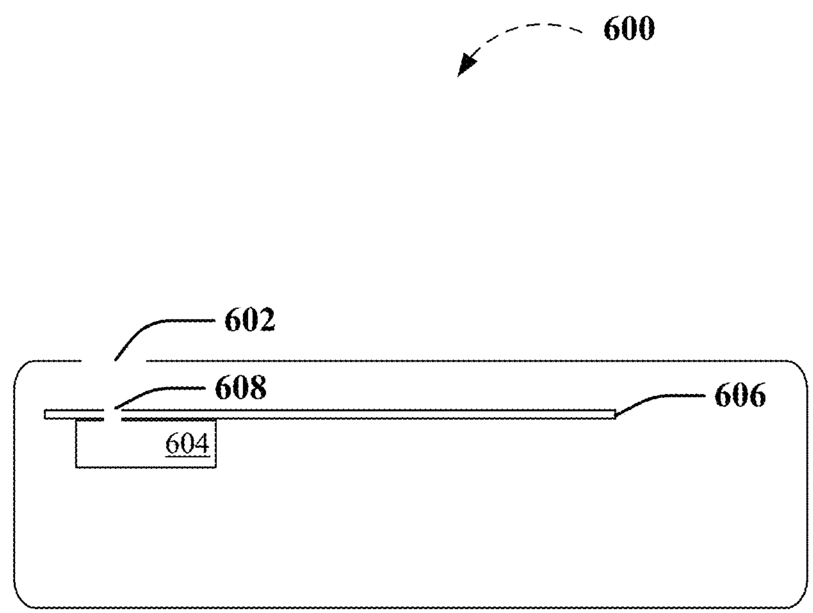
FIG. 6 illustrates a block diagram representative of an exemplary application of a microphone package including a MEMS acoustic sensor element.

FIG. 6 illustrates a block diagram representative of an exemplary application of various embodiments of the subject disclosure. More specifically, a block diagram of a host system 600 is shown to include an acoustic port 602 and a MEMS acoustic sensor 604 (e.g., comprising a MEMS acoustic sensor or microphone element 102/502) affixed to a PCB 606 having an orifice 608 or other means of passing acoustic waves to MEMS acoustic sensor 604. Examples of the MEMS acoustic sensor 604 can comprise a MEMS acoustic sensor or microphone element 102/502 of FIGS. 1-5. The host system 600 can be any system requiring acoustic sensors, such as a smartphone, a smart watch, a wearable exercise device, etc.

Figure 7:
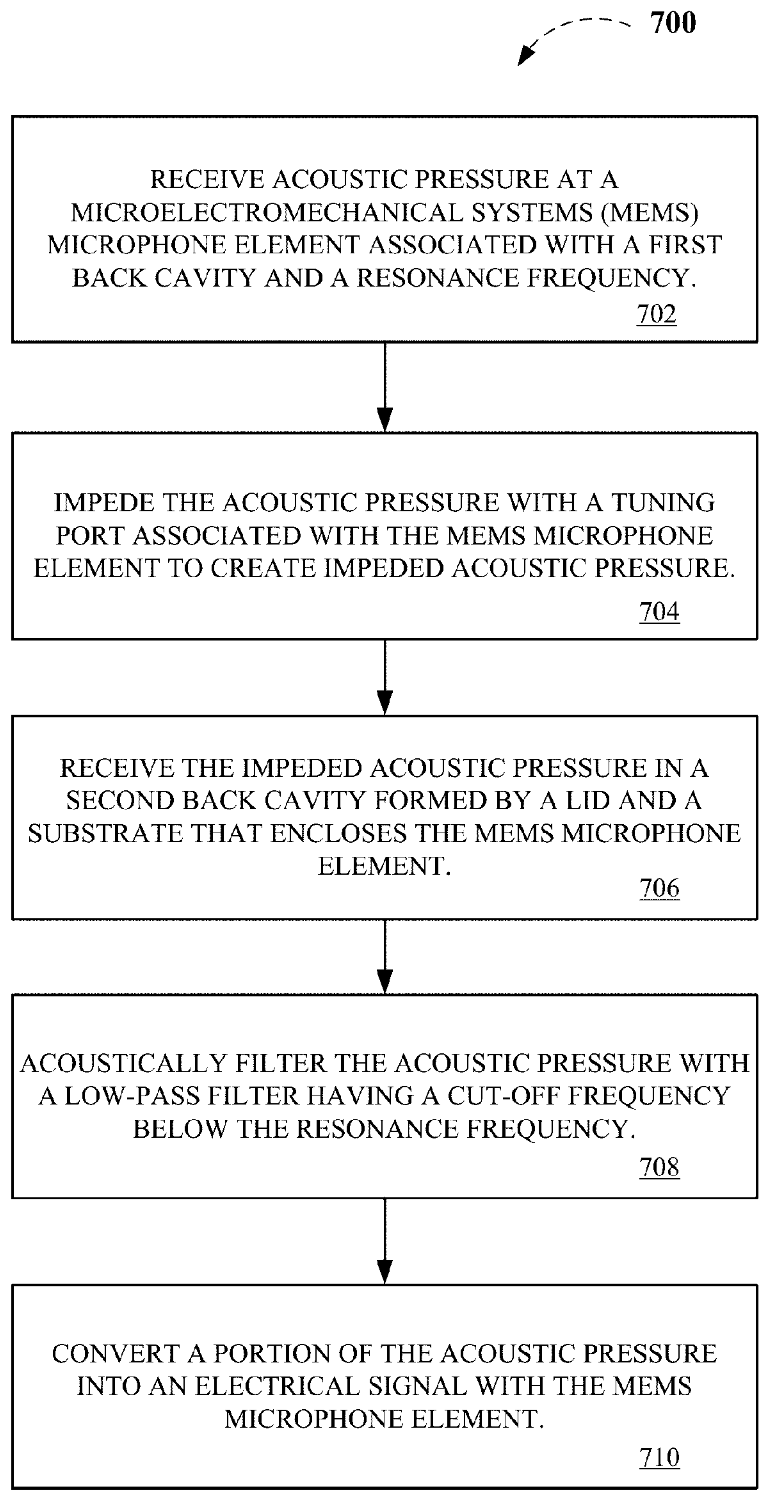
FIG. 7 depicts an exemplary flowchart of non-limiting methods associated with a MEMS microphone and tunable back cavity, according to various non-limiting aspects of the disclosed subject matter.

In view of the subject matter described supra, methods that can be implemented in accordance with the subject disclosure will be better appreciated with reference to the flowcharts of FIG. 7. While for purposes of simplicity of explanation, the methods are shown and described as a series of blocks, it is to be understood and appreciated that such illustrations or corresponding descriptions are not limited by the order of the blocks, as some blocks may occur in different orders and/or concurrently with other blocks from what is depicted and described herein. Any non-sequential, or branched, flow illustrated via a flowchart should be understood to indicate that various other branches, flow paths, and orders of the blocks, can be implemented which achieve the same or a similar result. Moreover, not all illustrated blocks may be required to implement the methods described hereinafter.

Exemplary Methods

FIG. 7 depicts an exemplary flowchart of non-limiting methods 700 associated with a MEMS microphone and tunable back cavity, according to various non-limiting aspects of the subject disclosure. As a non-limiting example, exemplary methods 700 can comprise receiving acoustic pressure at 702 using a MEMS microphone element (e.g., MEMS acoustic sensor element 102/502) associated with a first back cavity 106/506 and a resonance frequency. In an aspect, MEMS microphone element (e.g., MEMS acoustic sensor element 102/502) associated with a first back cavity 106/506 can receive acoustic pressure, acoustic waves, or an airflow. As described above, the MEMS microphone element can comprise the first back cavity 106/506 or the first back cavity 106/506 can house the MEMS microphone element. In a non-limiting aspect of exemplary methods 700, at 704, the acoustic pressure (e.g., acoustic pressure, acoustic waves, an airflow, etc.) can be impeded with a tuning port 110/510 associated with the MEMS microphone element to create impeded acoustic pressure. For instance, in a non-limiting aspect of methods 700, impeding the acoustic pressure can further comprise restricting airflow between the first back cavity and the second back cavity by using a baffle assembly 508 as further described above regarding FIG. 5, for example. In further non-limiting aspects of exemplary methods 700, restricting the airflow, in response to an acoustic impulse (e.g., extreme acoustic shock experienced in a guided drop test, etc.), can further comprise restricting airflow using a predetermined acoustic impedance of the baffle assembly 508 comprising at least one of multiple orifices, an adhesive 522 seal, or a porous mass 524, as further described above regarding FIG. 5.

In further non-limiting aspects, at 706, exemplary methods 700 can include receiving the impeded acoustic pressure in a second back cavity 112/512 formed by a cover or lid 114/514 and a substrate such as a package substrate 116/516 that encloses the MEMS microphone element. In further non-limiting of limitations of exemplary method 700, subject disclosure facilitates acoustically filtering the acoustic pressure with a low-pass filter having a cut-off frequency below the resonance frequency at 708. In a non-limiting aspect, acoustically filtering the acoustic pressure at 708 can further comprise one or more of acoustically filtering the acoustic pressure with a second-order acoustic low-pass filter determined, in part, by the tuning port 110/510 or acoustically filtering the acoustic pressure with a first-order acoustic low-pass filter determined, in part, by a set of holes or orifices of the tuning port 110/510.

In still further non-limiting aspects of exemplary methods 700, the methods can comprise converting a portion of the acoustic pressure into an electrical signal by using the MEMS microphone element at 710 and/or transmitting the electrical signal to ASIC CMOS 104/504 enclosed within the second back cavity 112/512 and communicatively coupled to the MEMS microphone element.

What has been described above includes examples of the embodiments of the subject disclosure. It is, of course, not possible to describe every conceivable combination of configurations, components, and/or methods for purposes of describing the claimed subject matter, but it is to be appreciated that many further combinations and permutations of the various embodiments are possible. Accordingly, the claimed subject matter is intended to embrace all such alterations, modifications, and variations that fall within the spirit and scope of the appended claims. While specific embodiments and examples are described in subject disclosure for illustrative purposes, various modifications are possible that are considered within the scope of such embodiments and examples, as those skilled in the relevant art can recognize.

In addition, the words "example" or "exemplary" is used herein to mean serving as an example, instance, or illustration. Any aspect or design described herein as "exemplary" is not necessarily to be construed as preferred or advantageous over other aspects or designs. Rather, use of the word, "exemplary," is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while an aspect may have been disclosed with respect to only one of several embodiments, such feature may be combined with one or more other features of the other embodiments as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. A device, comprising:

a first package comprising a microelectromechanical systems (MEMS) acoustic sensor element associated with a first back cavity, wherein the MEMS acoustic sensor element comprises a diaphragm and a stationary electrode, and wherein the first back cavity comprises an enclosure situated between the MEMS acoustic sensor element and a second back cavity;

a second package comprising a lid and a package substrate, wherein the package substrate has a port adapted to receive acoustic waves, wherein the second package comprises the second back cavity formed by the lid and the package substrate, and wherein the second package houses the MEMS acoustic sensor element; and a tuning port comprising at least opening in the enclosure, configured to restrict an airflow between the first back cavity and the second back cavity in response to an acoustic impulse, and that acoustically couples the first and second back cavities, wherein the MEMS acoustic sensor element is configured to operate at a predetermined resonance frequency.

2. The device of claim 1, wherein the tuning port is configured to provide a second-order acoustic low-pass filter having a cut-off frequency below the predetermined resonance frequency.

3. The device of claim 1, wherein the tuning port comprises a plurality of orifices configured to provide a first-order acoustic low-pass filter having a cut-off frequency below the predetermined resonance frequency.

4. The device of claim 1, wherein the tuning port comprises a baffle assembly.

5. The device of claim 1, further comprising:

an application specific integrated circuit (ASIC), wherein the ASIC is communicatively coupled to the MEMS acoustic sensor element.

6. The device of claim 4, wherein the baffle assembly comprises at least one of a baffle plate, an adhesive seal, or a porous mass within the first back cavity.

7. The device of claim 5, wherein the ASIC is mechanically connected to the MEMS acoustic sensor element.

8. The device of claim 6, wherein the baffle plate comprises multiple orifices.

9. The device of claim 8, wherein at least one of the multiple orifices, air voids in the adhesive seal, size of the porous mass, or porosity of the porous mass is configured to provide a predetermined acoustic impedance of the baffle assembly.

10. A microphone, comprising:

a microelectromechanical systems (MEMS) microphone element comprising a diaphragm and a stationary electrode and associated with a first back cavity, wherein the first back cavity comprises an enclosure having a tuning port situated between the MEMS microphone element and a second back cavity, and wherein the tuning port comprises at least one opening in the enclosure and is configured to restrict an airflow between the between the first back cavity and the second back cavity in response to an acoustic impulse;

a microphone package enclosure comprising a microphone package substrate and a lid that houses the MEMS microphone element and that forms the second back cavity, wherein the microphone package enclosure promotes direction of an acoustic pressure through a port in the microphone package substrate that is adapted to direct the acoustic pressure to the MEMS microphone element; and an ASIC substrate communicatively coupled to the MEMS microphone element, wherein the MEMS microphone element is configured to operate at a predetermined resonance frequency.

11. The microphone of claim 10, wherein the tuning port is configured to provide a second-order acoustic low-pass filter having a cut-off frequency below the predetermined resonance frequency.

12. The microphone of claim 10, wherein the tuning port comprises a plurality of orifices configured to provide a first-order acoustic low-pass filter having a cut-off frequency below the predetermined resonance frequency.

13. The microphone of claim 10, wherein the tuning port comprises a baffle assembly, configured to restrict an airflow between the first back cavity and the second back cavity in response to an acoustic impulse.

14. The microphone of claim 13, wherein the baffle assembly comprises at least one of multiple orifices, an adhesive seal, or a porous mass configured to provide a predetermined acoustic impedance of the baffle assembly.

15. A method, comprising:

receiving acoustic pressure by using a microelectromechanical systems (MEMS) microphone element associated with a first back cavity and a resonance frequency, wherein the MEMS microphone element comprises a diaphragm and a stationary electrode, and wherein the first back cavity comprises an enclosure having a tuning port, comprising at least opening in the enclosure, situated between the MEMS microphone element and a second back cavity, and configured to restrict an airflow between the first back cavity and the second back cavity in response to an acoustic impulse;

impeding the acoustic pressure with the at least opening of the tuning port associated with the MEMS microphone element to create impeded acoustic pressure; and receiving the impeded acoustic pressure in the second back cavity formed by a lid and a substrate that encloses the MEMS microphone element.

16. The method of claim 15, wherein the receiving the acoustic pressure includes receiving the acoustic pressure at the MEMS microphone element.

17. The method of claim 15, further comprising:

acoustically filtering the airflow with a low-pass filter having a cut-off frequency below the resonance frequency.

18. The method of claim 15, wherein the impeding the acoustic pressure includes restricting the airflow between the first back cavity and the second back cavity by using a baffle assembly.

19. The method of claim 15, further comprising:

converting at least a portion of the acoustic pressure into an electrical signal by using the MEMS microphone element.

20. The method of claim 17, wherein the acoustically filtering the airflow includes acoustically filtering the airflow with a second-order acoustic low-pass filter determined, at least in part, by the tuning port.

21. The method of claim 17, wherein the acoustically filtering the airflow includes acoustically filtering the airflow with a first-order acoustic low-pass filter determined, at least in part, by a plurality of orifices of the tuning port.

22. The method of claim 18, wherein the restricting the airflow includes restricting the airflow by using a predetermined acoustic impedance of the baffle assembly comprising at least one of multiple orifices, an adhesive seal, or a porous mass.

23. The method of claim 19, further comprising:

transmitting the electrical signal to an application specific integrated circuit (ASIC) that is enclosed within the second back cavity and communicatively coupled to the MEMS microphone element.

* * * * *